United States Patent
Kim et al.

[11] Patent Number: 5,940,413
[45] Date of Patent: Aug. 17, 1999

[54] METHOD FOR DETECTING OPERATIONAL ERRORS IN A TESTER FOR SEMICONDUCTOR DEVICES

[75] Inventors: Woo Jin Kim; Joo Suk Kwak; Kyung Wan Kim; Jeong Ho Bang, all of Asan, Rep. of Korea

[73] Assignee: Samsung Electronics Co., Ltd., Suwon-city, Rep. of Korea

[21] Appl. No.: 09/081,030

[22] Filed: May 19, 1998

[30] Foreign Application Priority Data

Jun. 30, 1997 [KR] Rep. of Korea ............ 97-29709

[51] Int. Cl.⁶ ............ G11C 29/00; G01R 31/28
[52] U.S. Cl. ............ 371/21.3; 371/21.2; 371/27.5
[58] Field of Search ............ 371/27.5, 27.1, 371/22.1, 22.33, 24, 21.1, 21.2, 21.3, 21.6; 365/201

[56] References Cited

U.S. PATENT DOCUMENTS

| | | | |
|---|---|---|---|
| 4,985,988 | 1/1991 | Littlebury | 29/827 |
| 5,130,646 | 7/1992 | Kojima | 324/158 R |
| 5,315,972 | 5/1994 | Judy et al. | 123/198 D |
| 5,465,850 | 11/1995 | Kase | 209/573 |

*Primary Examiner*—Hoa T. Nguyen
*Attorney, Agent, or Firm*—Jones Volentine, L.L.P.

[57] ABSTRACT

A method for detecting operational errors in a tester of a test system for determining whether a semiconductor device is good or failed includes a diagnostic test having the step of periodically inputting data to the device and checking whether the data can be retrieved intact from the tester. If not, then an operational error may be present in the tester. The method requires that the diagnostic test be carried out after a predetermined number of devices has been tested, and that the data inputted to the device during the diagnostic test be inputted to every I/O pin of the device. The diagnostic test includes inputting a value of 0 to each I/O pin, and then comparing the output of the device to a predetermined expected value. The diagnostic test also includes inputting a value of 1 to each I/O pin, and similarly comparing the output to an expected value.

20 Claims, 4 Drawing Sheets

METHOD FOR DETECTING OPERATIONAL ERRORS IN A TESTER FOR SEMICONDUCTOR DEVICES

BACKGROUND OF THE INVENTION

1. Field of the Invention

The present invention relates generally to a test method for detecting operational errors of the tester used for testing the electrical conditions of semiconductor devices. More particularly, the present invention relates to a test method for detecting operational errors of the tester, in which a failed device is erroneously sorted as a good one, using a diagnosis program.

2. Background of the Related Art

In general, semiconductor devices are subjected to various tests of the reliability of their electrical performance. The testing items can be varied depending on the type of semiconductor devices to be tested.

The test procedure employed for memory semiconductor devices in particular may be divided into two groups: first, direct current (DC) items for testing DC parameters, for example, the electric power consumption of the devices; and second, alternating current (AC) items for testing AC parameters such as the data storing performance of the devices. The AC tests are particularly important for memory devices, the main function of which is to store data. The AC tests are carried out by writing data to the device to be tested at various timings, voltage levels and patterns, and examining whether or not the written data can be retrieved intact. The tester used for this purpose will be described below.

FIG. 1 is a block diagram of a conventional test system 50 comprising a tester 51 for checking the electrical performance of the device to be tested and a handler 53 for loading/unloading the device to/from the tester 51. The operations of the tester 51 and of the handler 53 are controlled by a test program (not shown), and the tester 51 is electrically connected to the handler 53.

When the tester 51 transmits a signal to the handler 53 for starting the test, the handler 53 picks up the device to be tested and electrically connects it to the tester 51. Then, the tester 51 inputs the electrical test signal into the device and measures the output from the device, thereby determining whether the device is good (passed) or failed according to the test program. The handler 53 unloads the device from the tester 51 and sorts it as passed or failed depending on the results.

In this way, accurate tests on the memory devices can be carried out by using the test system as described above, so long as the tester itself is operating properly. However, like any other piece of equipment, the tester may be out of sequence, encounter electrical or mechanical trouble, or experience some other operational error.

The predominant error is that a good device is sorted as a failed one because of an operational error of the tester. This type of error does not have a significant effect on the yield of the test process, since the failed devices are usually subjected to a retest to determine the cause of the failure. Thus, devices that pass the retest are sorted as good devices. Also, the operator or engineer generally stops and checks the tester to locate any operational error when many failures occur for a certain test item.

On the other hand, when a failed device is sorted as a good one due to an operational error of the tester, the failed device causes irreparable damage to the quality control of the devices. Moreover, for such a case, the erroneously sorted good device is not subjected to a retest, and the operational error of the tester will not be detected.

In the test process, a diagnosis program provided by tester manufacturers is performed to detect any operational errors of the tester. However, the diagnosis program has a limitation, because it only checks the internal operation of the tester without using output data from the device. Moreover, different diagnosis programs are required for different memory semiconductor devices having different functional, operational and voltage conditions and different internal operation modes. Further, the diagnostic test using an auto-detection program requires a relatively long period of time. For example, it takes the T5581H model tester (ADVANTEST) about 3 hours to complete a diagnostic test using an auto-detection program.

SUMMARY OF THE INVENTION

Thus, an object of the present invention is to provide a method for detecting an operational error in a tester, thereby preventing mis-sorting of a failed device as a good one. Another object of the present invention is to permit examination of the tester during its operation, thereby reducing the time required for the examination.

According to one aspect of the present invention, there is provided a test method for detecting operational errors of a tester in a test system for determining whether a semiconductor device to be tested is good or failed. The method comprises the steps of: (a) loading and electrically connecting the semiconductor device to be tested to the tester; (b) inputting an electrical test signal into the device from the tester; (c) comparing an output value from the device with a predetermined expected value to determine whether the device is good or failed and sorting the device accordingly; and (d) inputting data to the device and checking whether the data can be retrieved from the device intact, in order to detect any operational errors of the tester.

BRIEF DESCRIPTION OF THE ATTACHED DRAWINGS

These and various other features and advantages of the present invention will be described in conjunction with the accompanying drawings, wherein like reference numerals designate like structural elements, and, in which.

DETAILED DESCRIPTION OF PREFERRED EMBODIMENT

The present invention will now be described in more detail with reference to the accompanying drawings.

Figure 1:
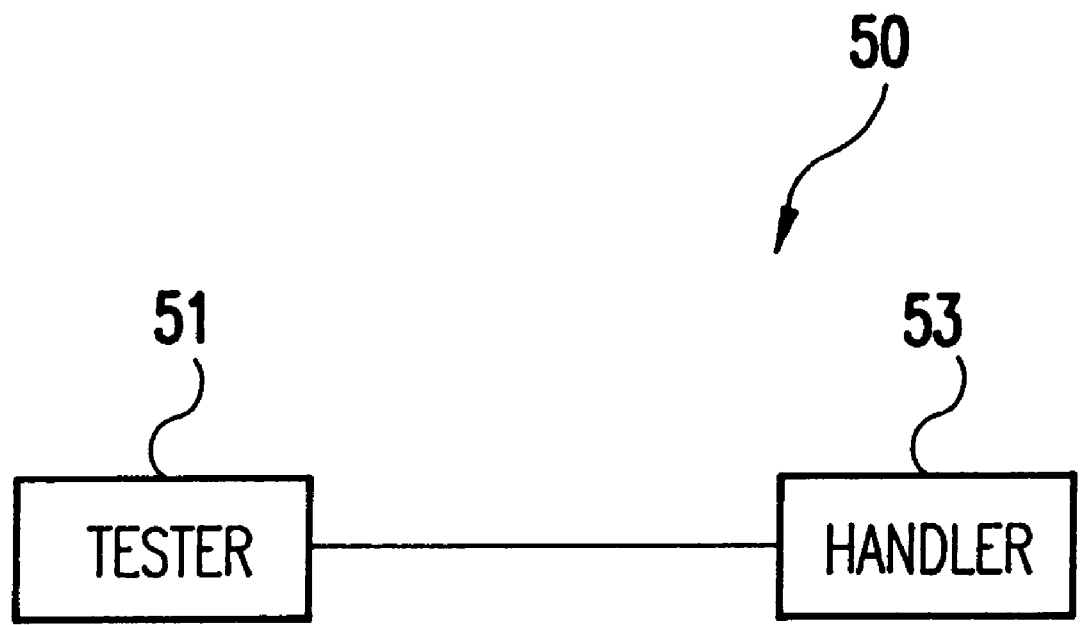
FIG. 1 is a block diagram of a conventional tester used for testing semiconductor devices.
Figure 2:
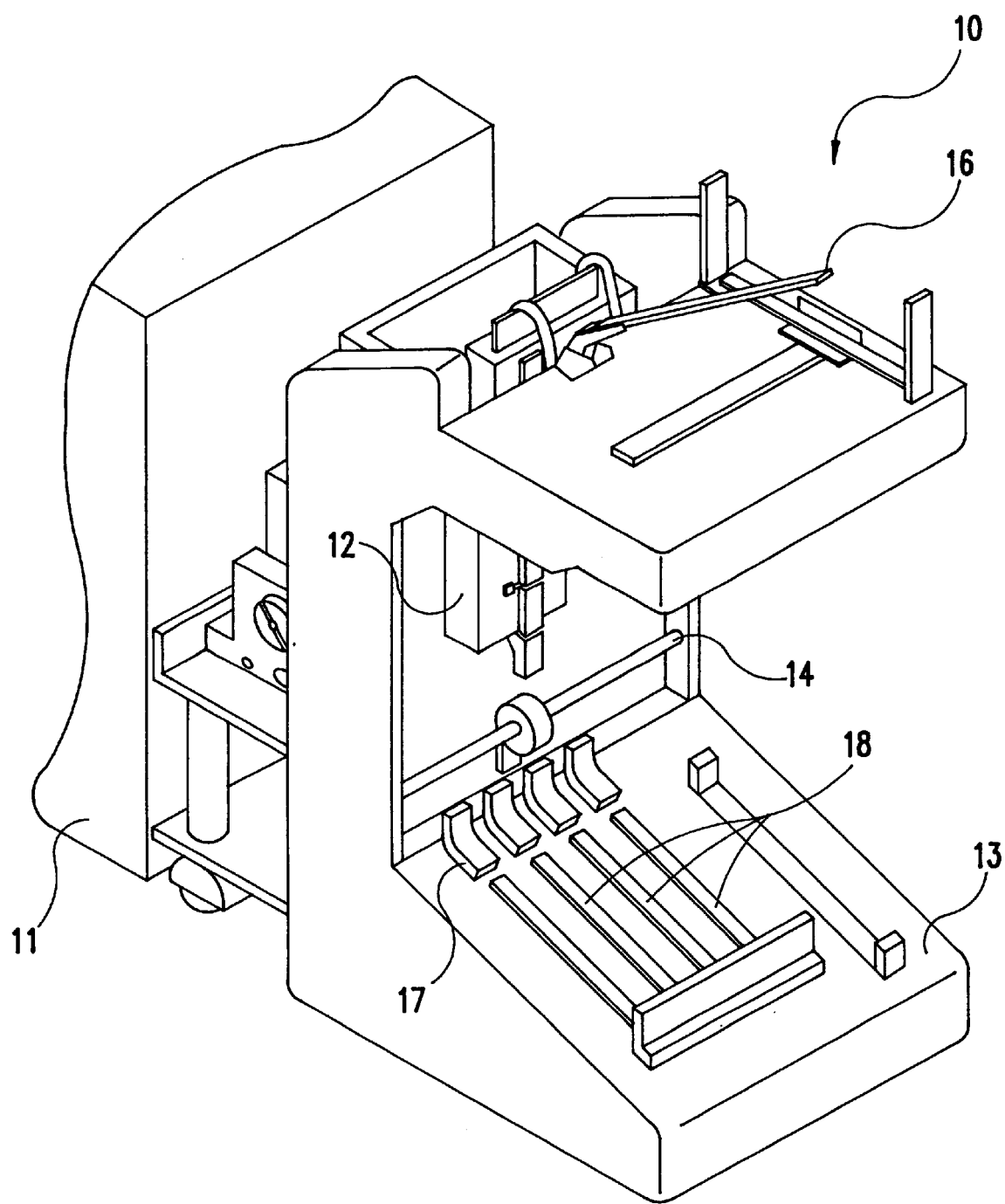
FIG. 2 is a perspective view of a conventional test system used for testing semiconductor devices.
Figure 3:
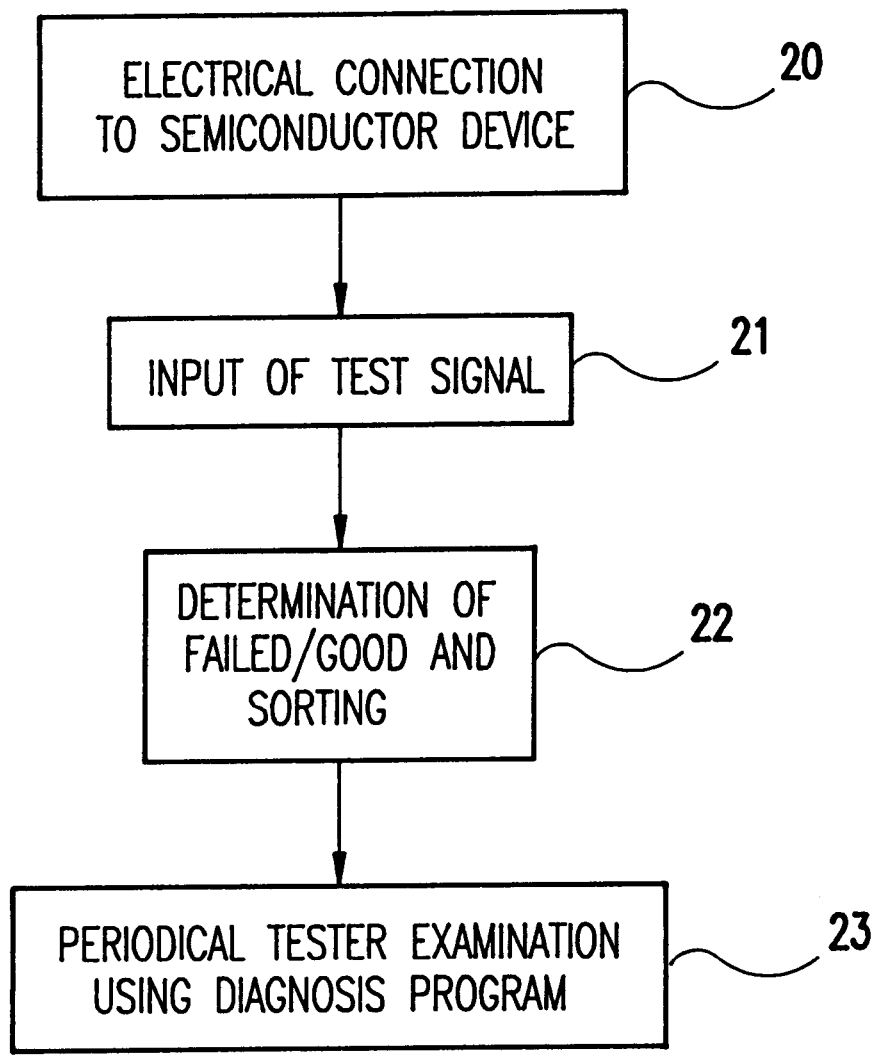
FIG. 3 is a flow chart depicting the procedure of detecting operational errors of the tester according to the present invention.

FIG. 2 is a perspective view of a conventional test system used for semiconductor devices; and FIG. 3 is a flow chart depicting the procedure of detecting the erroneous operation of the tester according to the present invention. With reference to FIGS. 2 and 3, the test system 10 comprises a tester 11 for checking the electrical performance of the device to be tested, and a handler 13 for loading/unloading the device to/from the tester 11.

Upon an instruction from the operator or from a test program, the tester 11 transmits a start signal to the handler 13. Then the handler 13 transfers the device from a tube 16 to a test socket 12 to electrically connect the device to the tester 11 (step 20 in FIG. 3).

Then, the tester 11, according to a memory semiconductor device test program for example, inputs the electrical test signals into the device (step 21 in FIG. 3). The test signals contain a power source signal, a control signal, an address signal and input data. The operation mode of the device is determined by controlling the timing of the control signal, and data '0' or '1' is stored into the device depending on the voltage level of the input data.

After the data is stored in the device, the tester 11 will read the written data according to the test signal. The tester 11 measures the output data from the device and compares it to the expected values to determine whether the device is passed (good) or failed. The device is deemed to have passed if the output value therefrom is the same as the predetermined expected value, while it is deemed to have failed if the output value therefrom is not the same as the expected value. The pass/fail determination is transmitted to the handler 13 to sort the device accordingly. When a signal from the tester 11 is inputted to the handler 13, the sorter 14 of the handler 13 unloads and sorts the device from the test socket 12 depending on the test results. A good device is placed into a tube 17 for good devices, while a failed one is placed into a tube 18 for failed devices (step 22 in FIG. 3).

The test cycle is repeated for every individual memory semiconductor device. During the test cycle, the tester is checked by periodically writing certain data into the device to be tested and checking whether the intact data can be retrieved by the device (Step 23 in FIG. 3).

It should be noted that this tester diagnosis program should be executed for every individual I/O pin of the device, unlike other conventional tester programs, and further a '0' as well as a '1' should be applied to each pin of the device.

In other conventional tester programs which test semiconductor integrated circuit devices, a plurality of bits from a plurality of I/O pins is compared to corresponding expected values to simultaneously check for the presence of errors. For example, if a device has eight I/O pins and the output data is '00001111', while the expected output value is '00001110', the device is deemed to have failed. Such a testing mode, wherein data from the plurality of I/O pins are examined at one time, can save time over a testing mode in which individual data from individual I/O pins are examined one at a time.

However, for the tester diagnosis program according to the present invention, individual I/O pins should be checked, because normal operation in one or more tester portions may hide an erroneous operation in another tester portion, resulting in a failure to detect an operational error of the tester. For example, suppose that the portion of the tester which examines the data '0' of the seventh I/O pin of eight (8) I/O pins of the device has an operational error and the remaining portions are normal. The tester will read the output data as '00001111', when the output data are '00001111' and the stored data are '00001111'. Accordingly, the tester seems to be working normally. However, if the stored data is '11110000', the tester will read the output data as '11110010', and the operational error of the tester would be detected.

As shown in the above example, since the results of the tester diagnosis can vary depending on the pattern of the output data, the individual I/O pins should be examined for individual data. For example, when a device having eight I/O pins is used, the data '0' is inputted to all respective individual I/O pins of the device and the output data from the individual I/O pins are compared with the expected value to determine whether the device is good or failed. Thereafter, the data '1' is inputted to all respective individual I/O pins of the device and the output data from the individual I/O pins are compared with the expected value to determine whether the device is good or failed. For this procedure, it is not necessary to examine all the output data in relation to the data connected to one I/O pin. It will be sufficient to examine several, for example 3–4 memory cells. Therefore, the total time for the diagnosis of the tester will be 0.2 seconds or less.

The tester diagnosis or test method according to the present invention is characterized in that a normal device is forced to give an erroneous result, and then the tester is examined to see whether or not it can recognize the forced error. In more detail, for example, if the normal output from the first I/O pin is '1', the expected value is deliberately set as '0' and then the tester compares these values. On the other hand, the examination can also be carried out by deliberately inputting to the tester a value opposite to the expected data output from the device, and having the tester compare them. In either case, if the tester determines that the device has passed (good), the tester has an operational error. While if the tester determines the device has failed, the tester works normally. When an operational error of the tester is confirmed, a message so indicating is shown in a display means and at the same time the tester is stopped for repair. After the cause of the error is found and repaired, the tester will again start functioning.

Figure 4:
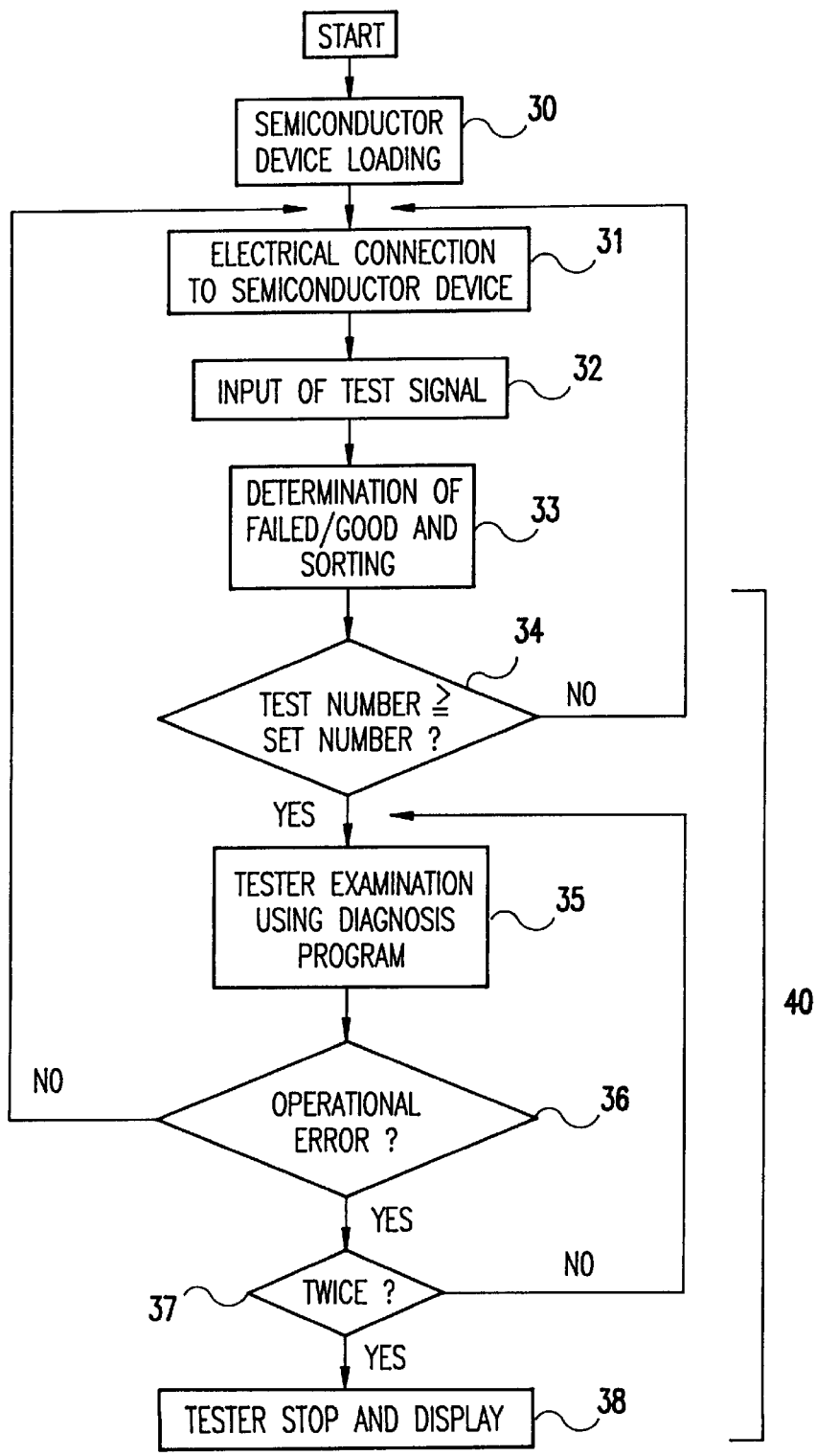
FIG. 4 is a flow chart of the diagnosis program used for detecting operational errors of the tester according to the present invention.

The test method according to the present invention will described with reference to FIG. 4, which is a flow chart of the diagnosis program used for detecting operational errors in the tester according to the present invention.

The device to be tested is loaded (step 30) by the handler and electrically connected to the tester (step 31). The tester inputs an electrical test signal into the device (step 32) and the test is carried out for every test item. Then, the tester determines whether the device is good or failed depending on the test results and sorts it accordingly (step 33). These steps 31–33 are the steps numbered 20–22 in FIG. 3. After the test for one device is completed, the test for the next device starts. The tester keeps track of how many tests have been carried out, and after a predetermined number ("set number") of tests are carried out, the diagnosis of the tester according to the present invention is carried out (step 40, which is the step numbered 23 in FIG. 3). The diagnosis includes a first step 34 in which it is determined if the test number is greater than or equal to the set number. If the answer is "no", then a test on an additional device is carried out. If the answer is "yes", then the diagnosis of the tester is carried out. The set number may be selected by one of ordinary skill in the art such as an operator depending on the type of test, the amount of time the tester has been in use, the type of device, and the like.

The test process (step 35) using the diagnosis program is carried out as follows: a value of '0' is inputted to all respective individual I/O pins of the device and the output data from the individual I/O pins are compared with a first expected value. The device is deemed to be good or failed depending on the results of this comparison, and the result of the determination by the tester is confirmed by inputting the value of '0' to all the I/O pins a second time. Then, a value of '1' is inputted to the individual I/O pins of the device, and the output data from the individual I/O pins are compared with a second expected value. The device is deemed to be good or failed depending on the results of this comparison, and the result of the determination by the tester is confirmed by inputting the value of '1' to all the I/O pins a second time.

If no operational error is detected by the test, the testing of additional devices by the tester will resume. At this point, the test number would be reset to zero (0). On the other hand, if an operational error is detected by the test, the test process will be repeated (step 37). If the same error is detected again, a message indicating the error is shown in a display means (step 38) and at the same time the tester is stopped for repair. Otherwise, if the same error is not detected again, the diagnosis program will return to step 35.

According to the test method of the present invention, any operational error of the tester in which a failed semiconductor device may be deemed good can be detected or prevented, thereby improving the reliability of the semiconductor device and preventing an unaccountable quality failure of the device. Further, when an operational error of the tester is detected, the tester is immediately stopped for repair, rendering an efficient control of the tester. Moreover, the test method of the present invention also makes it possible to detect any troubles which are not detected by the conventional auto-detection program. It is advantageous that the test method of the present invention can be carried out regardless of the specific test program for testing the semiconductor device. Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for detecting operational errors of a tester of a test system for determining whether a semiconductor device to be tested is good or failed, said method comprising:

(a) loading and electrically connecting the semiconductor device to be tested to the tester;
   (b) inputting an electrical test signal into the device by action of the tester;
   (c) comparing an output value from the device with a predetermined expected value to determine whether the device is good or failed and sorting the device accordingly; and
   (d) sequentially inputting, to the device, a first set of binary data and a second set of binary data opposite to the first set, and checking whether said first and second sets of data can be sequentially retrieved intact from the device, failure of sequential retrieval indicating operational errors of the tester such that determination by the tester of whether the device is good or failed in said step (c) is unreliable.

2. The method according to claim 1, wherein said semiconductor device is a memory semiconductor device.

3. The method according to claim 1, wherein said device has a plurality of I/O pins, and said step (d) is performed on each one of said plurality of I/O pins.

4. The method according to claim 3, wherein said step (d) is carried out after a predetermined number of devices have been tested by the tester.

5. The method according to claim 4, wherein said step (d) comprises:

(d-1) inputting a value of '0' to each one of said plurality of I/O pins of the device;
   (d-2) making a first comparison between output data from said I/O pins and a first expected value;
   (d-3) determining whether the device is good or failed based on said first comparison;
   (d-4) inputting a value of '1' to each one of said plurality of I/O pins of the device;
   (d-5) making a second comparison between output data from said I/O pins and a second expected value; and
   (d-6) determining whether the device is good or failed based on said second comparison.

6. The method according to claim 5, further comprising repeating steps (d-1) through (d-3) prior to performing steps (d-4) through (d-6).

7. The method according to claim 5, wherein said first and second expected values are opposite to respective corresponding normal output values.

8. The method according to claim 5, wherein said input data to the device are opposite to respective corresponding normal output values.

9. The method according to claim 4, further comprising repeating steps (d-4) through (d-6).

10. The method according to claim 1, wherein said step (d) comprises:

(d-1') inputting the first and second sets of data to the device;
    (d-2') checking whether said data can be retrieved from the device intact, in order to determine whether or not there is any operation error in the tester; and
    (d-3') if no operational error is found, returning to the step (a), or if an operational error is found, repeating steps (d-1') and (d-2') to confirm the operational error.

11. The method according to claim 10, wherein if step (d-3') confirms that there is an operational error, stopping operation of the tester and displaying said operational error on a display means.

12. The method according to claim 10, wherein if step (d-3') fails to confirm said operational error, returning to steps (d-1') and (d-2').

13. A method diagnosing a tester of a test system for determining whether a semiconductor device being tested is good or failed, said method comprising:

sequentially inputting, to the device, a first set of binary data and a second set of binary data opposite to the first set; and
    checking whether said first and second sets of data can be sequentially retrieved intact from the device, failure of sequential retrieval indicating operational errors of the tester such that the determination of whether the device is good or failed by the tester is unreliable.

14. The method according to claim 13, further comprising, when said checking indicates an operational error of the tester, halting use of the tester.

15. The method according to claim 13, further comprising, when said checking indicates an operational error of the tester, indicating the operational error to a user.

16. The method according to claim 13, wherein the device has a plurality of I/O pins, and said inputting and checking are performed on each one of said plurality of I/O pins.

17. The method according to claim 16, wherein:

said inputting comprises inputting a value of '0' to each one of said plurality of I/O pins of the device;

said checking comprises:
   making a first comparison between output data from said I/O pins and a first expected value; and
   determining whether the device is good or failed based on said first comparison;

said inputting further comprises inputting a value of '1' to each one of said plurality of I/O pins of the device; and said checking further comprises:
   making a second comparison between output data from said I/O pins and a second expected value; and
   determining whether the device is good or failed based on said second comparison.

18. The method according to claim 17, wherein said first and second expected values are opposite to respective corresponding normal output values.

19. The method according to claim 17, wherein said input data to the device are opposite to respective corresponding normal output values.

20. The method according to claim 13, wherein said inputting and checking are carried out after a predetermined number of devices have been tested by the tester.

* * * * *